(12) United States Patent
Zhao et al.

(10) Patent No.: US 6,486,521 B2
(45) Date of Patent: *Nov. 26, 2002

(54) OPTIMIZED FLOATING P+ REGION PHOTODIODE FOR A CMOS IMAGE SENSOR

(75) Inventors: Tiemin Zhao, Palo Alto, CA (US); Xinping He, San Jose, CA (US); Datong Chen, Fremont, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/969,920

(22) Filed: Oct. 2, 2001

(65) Prior Publication Data

US 2002/0017695 A1 Feb. 14, 2002

Related U.S. Application Data

(62) Division of application No. 09/440,481, filed on Nov. 15, 1999, now Pat. No. 6,339,248.

(51) Int. Cl.$^7$ ................................................ H01L 31/00
(52) U.S. Cl. ................... 257/443; 257/461; 257/463; 257/292; 438/48; 438/66; 438/67; 438/73; 438/80; 438/87
(58) Field of Search ..................... 257/443, 461, 257/463, 292; 438/48, 66, 67, 73, 80, 87

(56) References Cited

U.S. PATENT DOCUMENTS 5,625,210 A * 4/1997 Lee et al. .................... 257/292
6,150,676 A * 11/2000 Sasaki ........................ 257/191
6,339,248 B1 * 1/2002 Zhao et al. .................. 257/461
6,380,571 B1 * 4/2002 Kalnitsky et al. ........... 257/292

* cited by examiner

Primary Examiner—Nathan J. Flynn
Assistant Examiner—Scott R. Wilson
(74) Attorney, Agent, or Firm—Perkins Coie LLP

(57) ABSTRACT

A photodiode with an optimized floating P+ region for a CMOS image sensor. The photodiode is constructed with a P+/Nwell/Psub structure. The Nwell/Psub junction of the photodiode acts as a deep junction photodiode which offers high sensitivity. The P+ floating region passivates the silicon surface to reduce dark currents. Unlike a traditional pinned photodiode structure, the P+ region in the present invention is not connected to the Pwell or Psub regions, thus making the P+ region floating. This avoids the addition of extra capacitance to the cell. The photodiode may be included as part of an active pixel sensor cell, the layout of which is fully compatible with the standard CMOS fabrication process. This type of active pixel sensor cell includes the photodiode, and may be configured with a three transistor configuration for reading out the photodiode signals. Examples of other configurations that the photodiode can be used with include two transistors, four transistors, log scale, as well as its ability to be used in a passive pixel implementation. Also, an additional optional N type layer can be introduced in between the P+ region and Nwell to fine tune the junction profile for special applications. In addition, the field oxide region may be made to extend over the photodiode, so as to reduce the exposure of the diode area to the field oxide region edge, which can be a source of dark current due to the high electric fields and mechanical stresses.

1 Claim, 4 Drawing Sheets

OPTIMIZED FLOATING P+ REGION PHOTODIODE FOR A CMOS IMAGE SENSOR

This patent application is a Divisional of prior application Ser. No. 09/440,481, filed Nov. 15, 1999, entitled OPTIMIZED FLOATING P+ REGION PHOTODIODE FOR A CMOS IMAGE SENSOR and now U.S. Pat. No. 6,339,248.

FIELD OF THE INVENTION

The present invention relates to image sensing devices, and more particularly, to a pixel sensor cell.

BACKGROUND OF THE INVENTION

Integrated circuit technology has revolutionized various fields, including computers, control systems, telecommunications, and imaging. In the field of imaging, the charge coupled device (CCD) has been made popular by its manufacturing and performance characteristics, including its relatively low cost and small size. Nevertheless, the solid state CCD integrated circuits needed for imaging are relatively difficult to manufacture, and therefore are expensive. In addition, because of the differing processes involved in the manufacture of the CCD integrated circuits relative to MOS integrated circuits, the signal processing portion of the imaging sensor has typically been located on a separate integrated chip. Thus, a CCD imaging device includes at least two integrated circuits: one for the CCD sensor and one for the signal processing logic.

Another class of image sensors are the active pixel sensors. As noted in U.S. Pat. No. 5,625,210 to Lee et al. ("the '210 patent), an active pixel sensor refers to an electronic image sensor with active devices, such as transistors, that are associated with each pixel. The active pixel sensor has the advantage of being able to incorporate both signal processing and sensing circuitry within the same integrated circuit. Conventional active pixel sensors typically employ polysilicon photocapacitors or photodiodes as the image sensing elements.

The most popular active pixel sensor structure consists of three transistors and a N+/Pwell photodiode, which is a structure that is compatible with the standard CMOS fabrication process. Examples of other structures are shown in U.S. Pat. No. 5,587,596 (showing a one transistor cell), U.S. Pat. No. 5,926,214 (showing an N-transistor cell), and U.S. Pat. No. 5,933,190 (showing a log scale sensor). In such sensors, desirable characteristics include the ability for the device to have high sensitivity, combined with a low dark current (i.e., the current that is output from the sensor in a dark environment). In the design of active pixel sensors, it is known that for the same sensor size, a deeper junction photodiode will have a higher sensitivity than that of a shallow junction (such as in a typical N+/Pwell). However, the production of such devices usually requires modifications to the standard CMOS fabrication process, and in addition may increase dark current due to larger effective junction areas (when considered from a three-dimensional perspective).

Thus, two of the presently available alternatives are to either use the standard three-transistor plus N+/Pwell photodiode structure that can be formed with the standard CMOS fabrication process, or else abandon the standard CMOS fabrication process in favor of designs that are intended to improve the sensitivity and dark current characteristics. One active pixel sensor design that is not fabricated using the standard CMOS fabrication process is the pinned photodiode, as taught in the '210 patent.

The pinned photodiode has gained favor for its ability to have good color response for blue light, as well as advantages in dark current density and image lag. Reduction in dark current is accomplished by pinning the diode surface potential to the Pwell or Psubstrate (GND) through a P+ region. While the '210 patent provides a method for using a pinned photodiode and an active pixel sensor, the design taught suffers from the drawback of manufacturing complexity. In particular, as seen in the diagrams of the '210 patent, the manufacture of such an apparatus requires multiple masking and photolithography steps.

An improvement over the device taught in the '210 patent is shown in U.S. Pat. No. 5,880,495 to Chen (the '495 patent), which is hereby incorporated by reference. The '495 patent teaches an active pixel pinned photodiode structure that can be made with one less mask than the structure taught in the '210 patent. This is accomplished by removing the need for an $N^{31}$ channel underneath the transfer gate as shown in the '210 patent. Instead, a highly doped $N^+$ well (a "transfer well") adjacent to the transfer gate is formed that aids in the transfer of charge (the photo signal) from the pinned photodiode to the output circuitry. In addition, the masking steps shown in the '210 patent to form the lightly doped $N^-$ channel must be precisely aligned to be underneath the transfer gate. In contrast, the alignment of the mask in the '495 device is relatively robust to misalignment.

Even with the improved structure taught in the '495 patent, the pinned photodiode configuration still has certain drawbacks. For example, in a pinned photodiode structure there are four transistors, so the fill factor is smaller for the same area, which results in less sensitivity. In addition, the fabrication process for such a configuration requires significant modification from the standard CMOS fabrication process, due to the buried channel TG transistor. As also noted with reference to the '210 patent, the pinned photodiode configuration may cause image lag due to the incomplete transfer of charge from the diode to the floating node, if the junction profile is not perfectly optimized for the charge transfer.

Thus, what is needed, is a pixel photodiode structure that can be formed utilizing the standard CMOS process, while having a high sensitivity and low dark current.

SUMMARY OF THE INVENTION

A pixel sensor for use in an imaging array and formed in a semiconductor substrate having a first conductivity-type is disclosed. In accordance with one aspect of the invention, the pixel sensor includes a photodiode which is constructed with a P+/Nwell/Psub structure.

The Nwell/Psub junction acts as a deep junction photodiode which offers high sensitivity. The P+ region passivates the silicon surface to reduce dark current. Unlike a pinned photodiode structure, the P+ region in the present invention is not connected to the Pwell or Psub layers, thus making the P+ region floating. This avoids the addition of extra capacitance to the cell. When a contact is made to the diode, the performance may be improved by making sure that the P+ in the contact area is blocked to ensure that it is floating, while also making sure that the N+ is present to ensure good contact to the Nwell.

In accordance with another aspect of the invention, the photodiode is implemented as an active pixel sensor cell, then entire layout of which is compatible with the standard CMOS fabrication process. In addition, this active pixel sensor cell device can be formed utilizing the standard three transistor cell, as opposed to the four transistor cell required for the pinned photodiodes. Alternatively, other configurations may also be used with the photodiode, such as a passive pixel, a two transistor, a four transistor, or a log scale cell.

In accordance with another aspect of the invention, the three transistor active pixel sensor cell includes a reset transistor formed in a semiconductor substrate next to the photodiode, as well as a buffer transistor and a row select transistor. To form the reset transistor, a Pwell is formed in a semiconductor substrate next to the Nwell of the photodiode. Thereafter, a gate is formed over the Pwell, and the source and drain N+ regions are also formed. The drain N+ region is formed over the Pwell, whereas the source N+ region is formed over part of the junction between the Nwell and the Pwell. A field oxide isolation region (e.g., LOCOS isolation) is formed on either side of the Nwell and the Pwell.

In accordance with another aspect of the invention, an additional N type region can be introduced in between the P+ region and Nwell to fine-tune the junction profile for special applications.

In accordance with another aspect of the invention, another variation to the structure is to have the P+/Nwell/Psub photodiode all under the field oxide isolation region. This reduces the exposure of the diode area to the field oxide isolation region edge, which can be a source of dark current due to the high electric fields and mechanical stresses.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

The present invention is an improvement to the active pixel sensors taught in the '210 and '495 patents. Much of the description of the circuitry of an active pixel sensor is recited in the '210 patent and the cited references in the '210 patent. Those designs are considered to be instructive as to the basic design and operation of active pixel sensors.

The present invention is an active pixel sensor that can be formed with the standard CMOS fabrication process, while also having the desirable characteristics of high sensitivity combined with a low dark current. The dark current is reduced by utilizing a P+ region that passivates the silicon surface. Unlike the pinned photodiode structures, the P+ region in the present invention is not connected to the Pwell or Psub regions, thus making it floating. The floating P+ region avoids the addition of extra capacitance to the cell.

Figure 1:
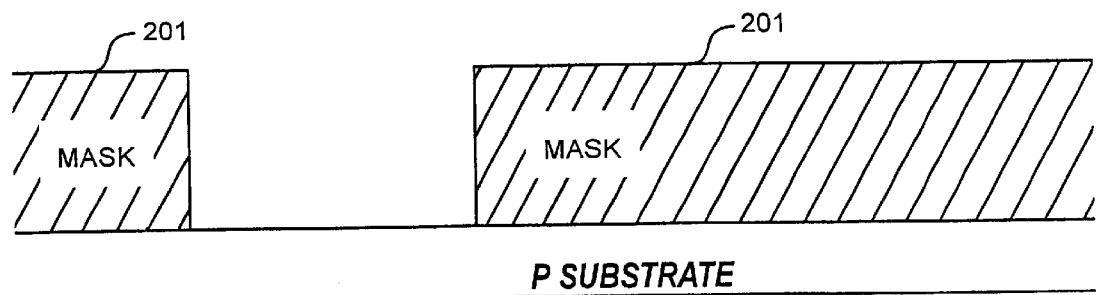
FIG. 1 is a Psubstrate with a first mask to begin the formation of a pixel sensor according to the present invention.

As previously noted, the device of the present invention is formed using the standard CMOS fabrication process. In the description below, the preferred dopant for N type implant is Phosphorus, while the preferred dopant for a P type implant is Boron. The standard CMOS fabrication process may start with a P type semiconductor substrate, as illustrated in FIG. 1. As illustrated in FIG. 1, a P type semiconductor substrate 101 is initially covered with a photolithography mask 201. The photolithography mask 201 leaves a portion of the Psubstrate 101 exposed, so that it may receive a first N type ion implant, as illustrated with respect to FIG. 2.

Figure 2:
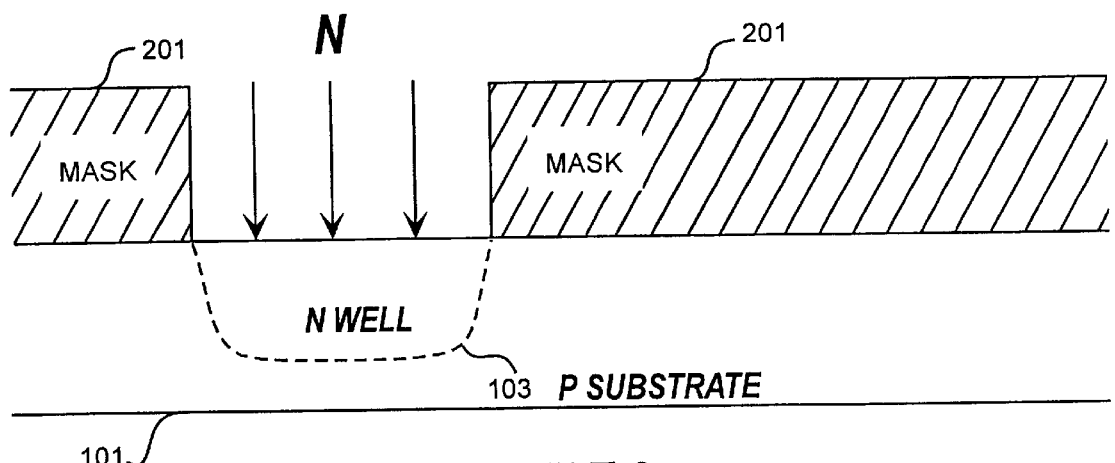
FIG. 2 shows the formation of an Nwell in the Psubstrate.

As illustrated in FIG. 2, a first N type ion implant is performed to implant a deep Nwell 103. As will be described in more detail below, the Nwell 103 that is implanted in the Psubstrate 101 will also include an additional P+ region, so as to form a P+/Nwell/Psub photodiode. In accordance with the present invention, the Nwell 103 is formed fairly deep in the substrate, so as to increase the sensitivity of the photodiode. The increase in sensitivity is achieved because the deep implant yields substantial increases in the photo response, due to an increase collection path for the instant photo-generated carriers.

Figure 3:
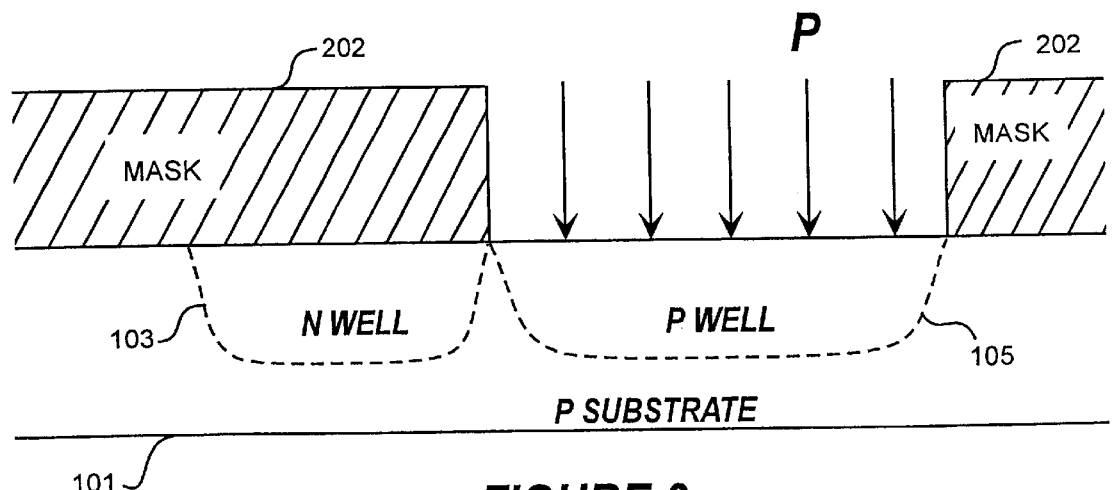
FIG. 3 shows the formation of a Pwell in the Psubstrate.

As illustrated in FIG. 3, a photolithography mask 202 is deposited onto a portion of the Psubstrate. Thereafter, a P type ion implant is performed to create a deep Pwell 105. As will be described in more detail below, the Pwell is used in part for the formation of a reset transistor, as well as buffer transistor 151 and row select transistor 153.

Figure 4:
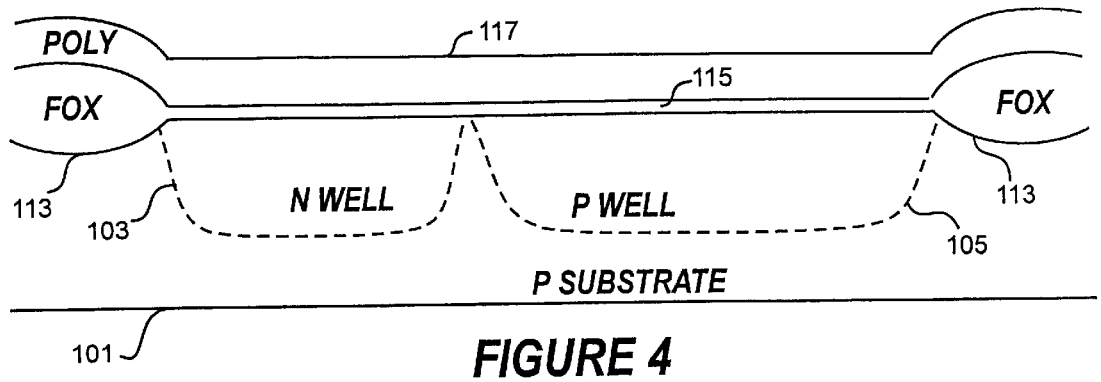
FIG. 4 shows the addition of the field oxide regions and a poly layer.

As illustrated in FIG. 4, field oxide regions 113 are formed in the substrate 101 using any suitable conventional semiconductor processing method, such as LOCOS. The field oxide regions 113 define an active area in which the photodiode is formed. Also formed on top of the substrate 101 between the field oxide regions 113 is an isolation oxide 115. The isolation oxide 115 is also referred to as a gate oxide and is preferably formed from silicon dioxide. The method that is used to form the silicon dioxide isolation oxide layer 115 can be one of any well known techniques, including the thermal oxidation of silicon. As also shown in FIG. 4, a layer of polysilicon 117 is deposited over the substrate 101. The polysilicon may be deposited using any conventional technique, such as low pressure chemical vapor deposition (LPCVD).

Figure 5:
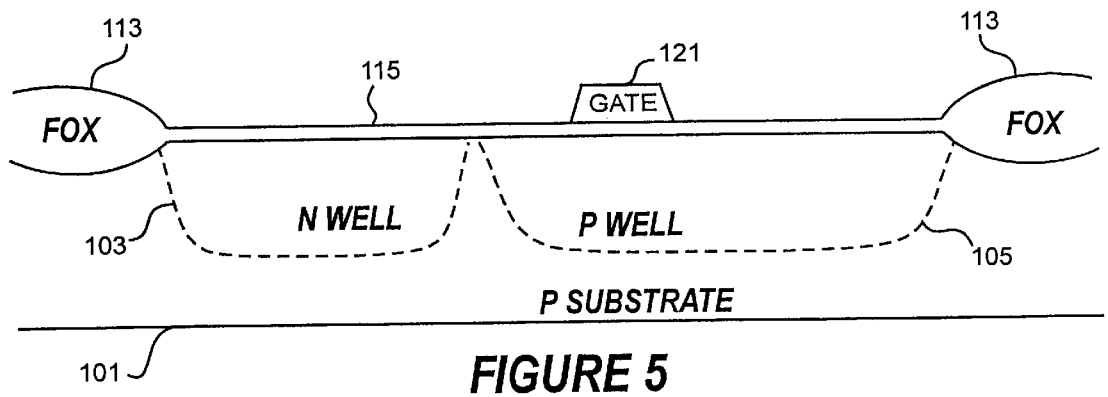
FIG. 5 shows the formation of a gate from the poly layer.

As illustrated in FIG. 5, the polysilicon layer 117 is patterned and etched using conventional photolithography and masking techniques to form a control gate 121. As described below, this will be the gate 121 for the reset transistor.

Figure 6:
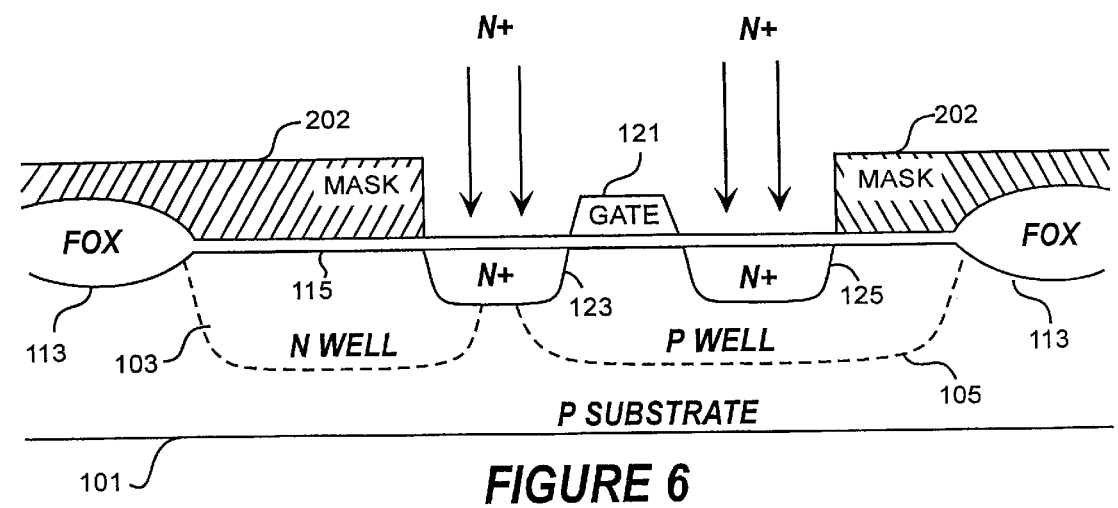
FIG. 6 shows the formation of N+ regions on either side of the gate.

As illustrated in FIG. 6, a photolithography mask 203 is deposited. The mask 203 is formed using conventional lithography techniques. Thereafter, high concentration doping is used to form N+ regions using the mask 203 as an implementation mask. The implementation of the high concentration doping is performed using known techniques in the prior art and conventional dopants. This forms an N+ region 123 and an N+ region 125. Note that the N+ region 123 is formed at the border between the Nwell 103 and the Pwell 105. As will be described in more detail below, the N+ regions 123 and 125 will be used as the source and drain of the reset transistor.

Figure 7:
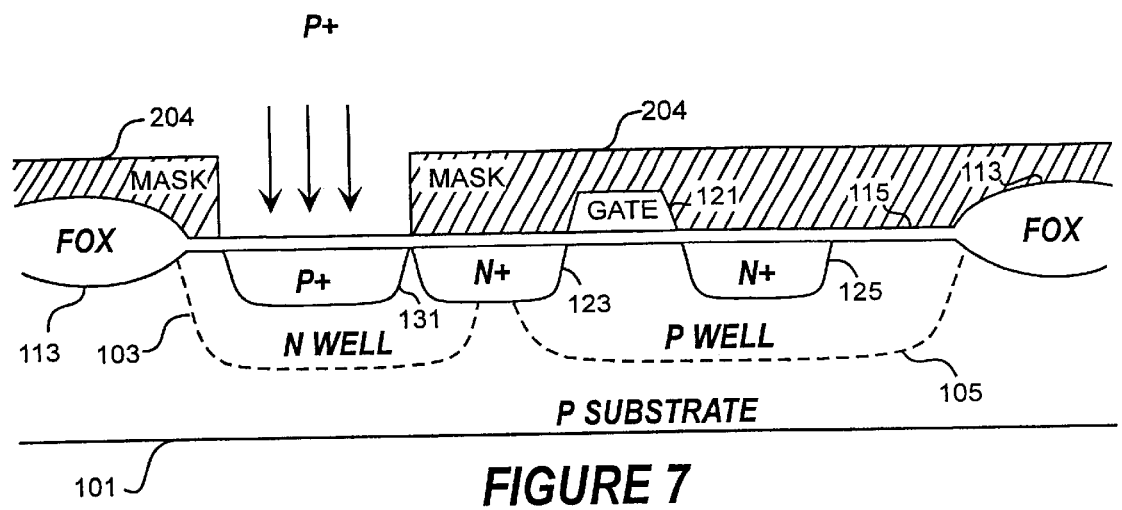
FIG. 7 shows the formation of a floating P+ region as part of the photodiode.

As illustrated in FIG. 7, a photolithography mask 204 is deposited, leaving exposed a region between one of the field oxide regions 113 and the N+ region 123. Thereafter, high concentration doping is used to form a P+ region using the mask 204 as an implementation mask. This forms the P+ region 131, which is the previously described floating P+ region of the photodiode, which passivates the silicon surface to reduce dark currents. The P+ region formation can be the same as the PMOS source/drain implant that is done as part of the standard CMOS process. Unlike the pinned photodiode structure, the P+ region 131 of the present invention is not connected to the Psubstrate 101 or the Pwell 105, thus making it floating. Therefore, the P+ region 131 does not add extra capacitance to the cell. It is noted that when a contact is made to the photodiode, the P+ region in the contact area should be blocked to ensure that it is floating, and N+ should be present to ensure good contact to the Nwell 103.

Figure 8:
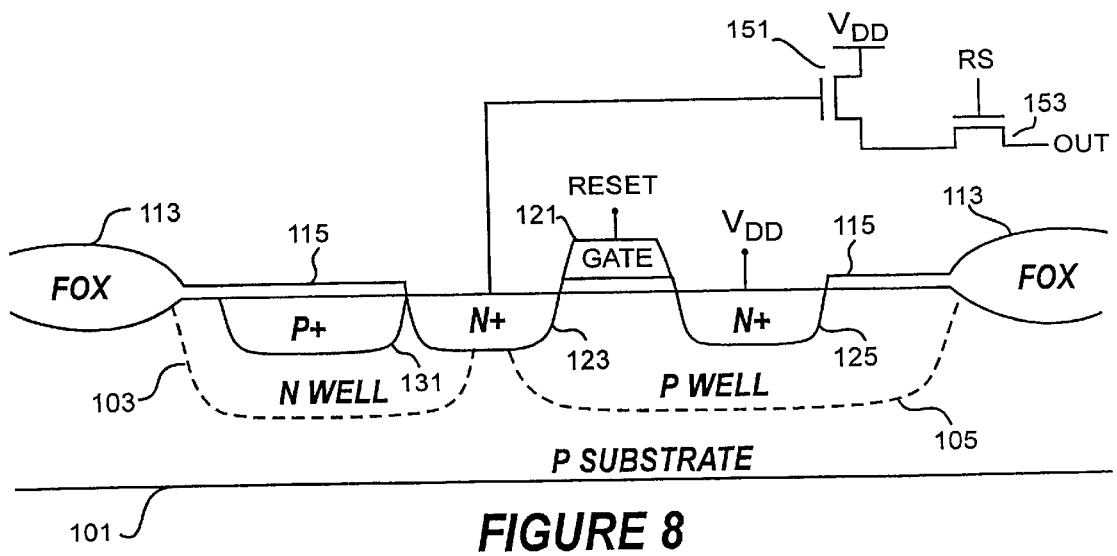
FIG. 8 shows a partial circuit diagram illustrating the connections of a completed active pixel sensor device with a three transistor structure.

As further described in the '210 patent and as seen in FIG. 8, the N+ region 123 is connected to output circuitry. The output circuitry includes a buffer transistor 151, in addition to a row select transistor 153. The N+ region 123 is coupled to the gate of the buffer transistor 151, while the drain of the buffer transistor 151 is coupled to a fixed voltage such as $V_{DD}$. The source of the transistor 151 is coupled to the drain of the row select transistor 153, while the source of the transistor 153 provides the output of the processing circuitry. The gate of the row select transistor 153 receives a row select signal RS.

As also illustrated in FIG. 8, the N+ region 125 is connected to a fixed voltage such as the supply voltage $V_{DD}$. The reset gate 121 is periodically activated by a reset signal. When the reset signal is "on," the channel under the reset gate 121 is made conducting, and current is able to flow through the transistor so as to reset the photodiode.

As illustrated, the present invention provides an active pixel photodiode structure that can be formed with the standard CMOS process. In addition, the device of FIG. 8 is formed with only three transistors, as compared to the four transistors required for the previously described pinned photodiodes. As a result, for a given fabrication area, the present device can devote more area to photosensing rather than the processing circuitry. In addition, this avoids the image lag that can sometimes result in pinned photodiodes due to an incomplete transfer of charge from the diode to the floating node, in cases when the junction profile is not perfectly optimized for the charge transfer.

The described structure of the present invention provides for a deep junction photodiode, as seen in the deep Nwell/Psub junction (as seen between the Nwell 103 and the Psubstrate 101), thereby providing for high sensitivity of the device. In addition, dark current is reduced in that the P+ region 131 passivates the silicon surface. As noted above, the P+ region 131 is not connected to the Pwell 105 or the Psub 101, thus making the P+ region 131 floating. Because the P+ region 131 is floating, it does not add extra capacitance to the cell.

Figure 9:
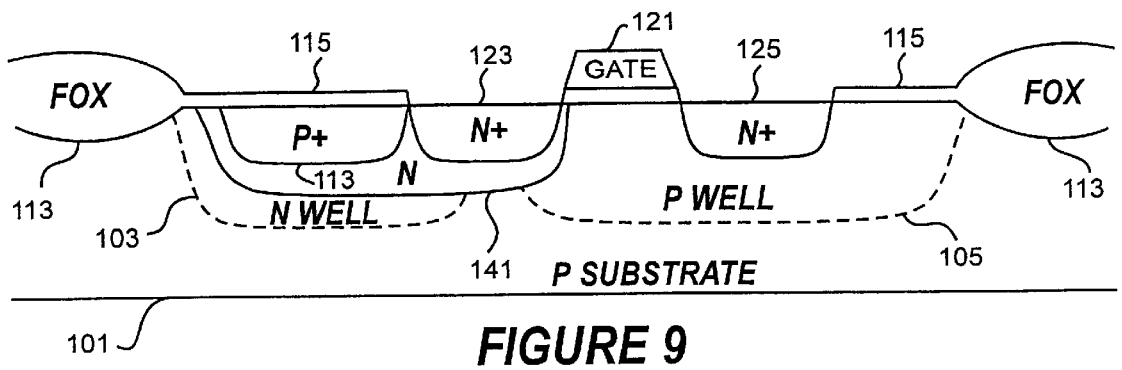
FIG. 9 shows an alternate embodiment with an additional N type region.

FIG. 9 shows an alternate embodiment of the invention. As illustrated in FIG. 9, an additional N type region 141 has been introduced in between the P+ region 131 and the Nwell 103. This additional N type region 141 is added to fine-tune the junction profile for special applications.

Figure 10:
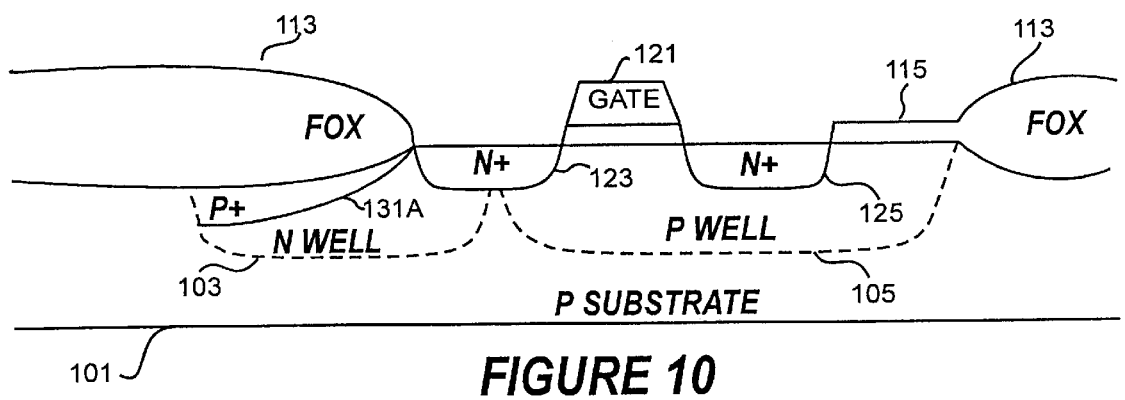
FIG. 10 shows another alternate embodiment in which the photodiode is located under the field oxide region edge.

FIG. 10 illustrates another alternate embodiment. As illustrated in FIG. 10, the field oxide region 113 is now located over the P+/Nwell/Psub photodiode. By having this photodiode under the field oxide insulation 113, the exposure of the diode area to the field oxide edge is reduced. The exposure of the diode area to the field oxide edge can be a source of dark current due to the high electric fields and mechanical stresses experienced in this region.

While the preferred embodiment of the invention has been illustrated and described, it will be appreciated that various changes can be made therein without departing from the spirit and scope of the invention. For example, while the formation of the active pixel sensor illustrated in FIGS. 2 and 3 has generally shown the Nwell 103 being formed before the Pwell 105, these processes could be performed in the reverse order. In addition, while the formation of the field oxide regions 113 in FIG. 4 was generally illustrated as being formed after the Nwell 103 and Pwell 105, the Nwell and/or Pwell could be formed after the formation of the field oxide regions 113. While the N+ regions 123 and 125 of FIG. 6 were generally shown as being formed before the P+ region 131 of FIG. 7, these processes could be performed in reverse order. In addition, the optional N type region 141 of FIG. 9 can be formed either before or after the N+ regions 123 and 125 and the P+ region 131. In addition, the optional N region 141 of FIG. 9 could be formed between the N+ regions 123 and 125 and the P+ region 131, or between the P+ region 131 and the N+ regions 123 and 125. It is also understood where the device has generally been shown using different types of P or N type materials, the types of materials could be switched to produce similar results. For example, rather than the P+/Nwell/Psub photodiode that was formed with respect to the P+ layer 131, Nwell 103, and Psubstrate 101, the alternate types of materials could be used to form a N+/Pwell/Nsub photodiode.

In addition, the above-described photodiode could also be used in other applications. For example, rather than an active pixel sensor, the photodiode could be implemented in a passive pixel sensor. Also, rather than being implemented in a three transistor active pixel sensor, other styles of active pixel sensors could be used, such as a two transistor, a four transistor, or a log scale implementation. As previously noted, some examples of general prior art design approaches to these other styles are shown in U.S. Pat. Nos. 5,587,596; 5,926,214; and 5,933,190.

The present invention has thus been described in relation to a preferred and several alternate embodiments. One of ordinary skill after reading the foregoing specification will be able to affect various changes, alterations, and substitutions of equivalents without departing from the broad concepts disclosed. It is therefore intended that the scope of the Letters Patent granted hereon be limited only by the definitions contained in appended claims and equivalents thereof, and not by limitations of the embodiments described herein.

The embodiments of the invention in which an exclusive property or privilege is claimed are defined as follows:

1. A photodiode formed in a semiconductor substrate of a first conductivity type, comprising:
   a first well of a second conductivity type formed in the semiconductor substrate;
   a first region of the first conductivity type with high concentration doping formed in the first well; and
   wherein the first region of the first conductivity type with the high concentration doping is not connected to the semiconductor substrate such that the first region is electronically floating.

* * * * *